US011705417B2

(12) United States Patent
Jha et al.

(10) Patent No.: US 11,705,417 B2
(45) Date of Patent: Jul. 18, 2023

(54) BACKSIDE METALLIZATION (BSM) ON STACKED DIE PACKAGES AND EXTERNAL SILICON AT WAFER LEVEL, SINGULATED DIE LEVEL, OR STACKED DIES LEVEL

(71) Applicant: Intel Corporation, Santa Clara, CA (US)

(72) Inventors: Chandra Mohan Jha, Tempe, AZ (US); Prasad Ramanathan, Chandler, AZ (US); Xavier F. Brun, Chandler, AZ (US); Jimmin Yao, Chandler, AZ (US); Mark Allen, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 16/596,338

(22) Filed: Oct. 8, 2019

(65) Prior Publication Data

US 2021/0104484 A1 Apr. 8, 2021

(51) Int. Cl.

| | |
|---|---|
| ***H01L 23/48*** | (2006.01) |
| ***H01L 23/52*** | (2006.01) |
| ***H01L 23/00*** | (2006.01) |
| ***H01L 23/532*** | (2006.01) |

(Continued)

(52) U.S. Cl.

CPC .......... *H01L 24/14* (2013.01); *H01L 23/3114* (2013.01); *H01L 23/3128* (2013.01); *H01L 23/3735* (2013.01); *H01L 23/53209* (2013.01)

(58) Field of Classification Search

CPC ........... H01L 23/3114; H01L 23/53209; H01L 23/4827; H01L 24/95; H01L 24/32; H01L 2224/03002; H01L 2224/0401; H01L 24/05; H01L 2224/131; H01L 2224/16245; H01L 2224/2784; H01L 2224/291; H01L 2224/32245; H01L 2224/73267; H01L 2224/81895; H01L 2224/92125; H01L 2224/95; H01L 2924/181; H01L 24/29; H01L 23/3675; H01L 2224/05073; H01L 2224/05082; H01L 2224/27002;

(Continued)

(56) References Cited

U.S. PATENT DOCUMENTS

| | | | | |
|---|---|---|---|---|
| 2014/0264820 A1* | 9/2014 | Hu | ...................... | H01L 23/3736 257/713 |
| 2020/0091034 A1* | 3/2020 | Shao | ...................... | H01L 24/73 |

* cited by examiner

*Primary Examiner* — Theresa T Doan

(74) *Attorney, Agent, or Firm* — Schwabe, Williamson & Wyatt, P.C.

(57) ABSTRACT

Embodiments include semiconductor packages and methods to form the semiconductor packages. A semiconductor package includes a plurality of first dies on a substrate, an interface layer over the first dies, a backside metallization (BSM) layer directly on the interface layer, where the BSM layer includes first, second, and third conductive layer, and a heat spreader over the BSM layer. The first conductive layer includes a titanium material. The second conductive layer includes a nickel-vanadium material. The third conductive layer includes a gold material, a silver material, or a copper material. The copper material may include copper bumps. The semiconductor package may include a plurality of second dies on a package substrate. The substrate may be on the package substrate. The second dies may have top surfaces substantially coplanar to top surface of the first dies. The BSM and interface layers may be respectively over the first and second dies.

17 Claims, 4 Drawing Sheets

102 120 144 143c 142c 141c 122 121 140c 300 341 310a 310b 340 322 315 320 311a 311b 302 380 318 355 331 354 323 330 354

(51) Int. Cl.
*H01L 23/373* (2006.01)
*H01L 23/31* (2006.01)

(58) Field of Classification Search
CPC . H01L 2224/29019; H01L 2224/83895; H01L 23/3736
USPC .......................................................... 257/738
See application file for complete search history.

BACKSIDE METALLIZATION (BSM) ON STACKED DIE PACKAGES AND EXTERNAL SILICON AT WAFER LEVEL, SINGULATED DIE LEVEL, OR STACKED DIES LEVEL

FIELD

Embodiments relate to packaging semiconductor devices. More particularly, the embodiments relate to semiconductor devices with backside metallization (BSM) on stacked die packages and external silicon at a wafer level, a singulated die level, or a stacked dies level.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as with multi-chip packages (MCPs), while optimizing the performance of each device, however is not without issue.

MCPs typically include multiple single dies, stacked dies, and external silicon dies assembled together onto a single package. Currently, a native bare silicon surface or a polished bare silicon surface along with some type of polymer-based thermal interface materials (TIMs) (PTIMs) are used in the existing industry with the MCPs (or stacked die packages) for thermal dissipation and cooling. The conductivity of PTIM, however, is lower compared to that of metallic or solder-based TIMs (STIMs), and thermal solutions based on PTIMs have overall lower heat dissipation capabilities than STIMs, thereby limiting device/product performance.

In particular, existing technologies generally do not have any type of backside metallization (BSM) that can be implemented on MCPs (or stacked die packages) and used to enhance thermal heat dissipation with better TIMs, such as STIMs. Also, no existing packaging solutions can implement BSM at the unit/die level (i.e., the current BSM process can only be performed at the wafer level). Furthermore, existing packaging technologies have encountered several problems implementing the same uniform BSM materials (or layers) on each die of the MCP, including single dies, stacked dies, and/or external silicon dies (e.g., high-bandwidth memory (HBM) dies that may be incorporated into the MCP even when such dies are acquired externally).

That is, existing packaging technologies cannot generally implement (or deposit) the same BSM layer onto the stacked dies and other neighboring external silicon dies of the MCP, where such BSM layer can form a uniform, single thermal stack having the same BSM materials, TIM materials, and corresponding interfaces. Another problem with implementing the same BSM layer on each of the multiple dies in the MCP includes depositing (or forming) such BSM layer on individual, singulated dies without exposing the sidewalls of the singulated dies to the BSM layer that is deposited/formed on these sidewalls.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
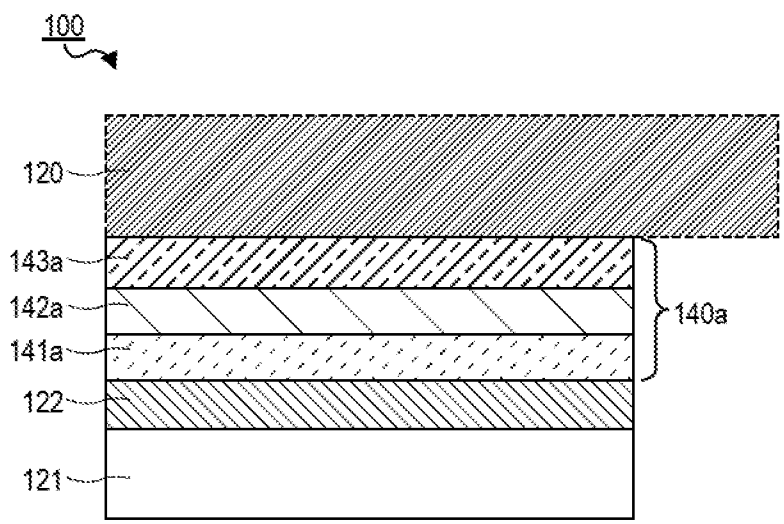
FIG. 1A is an illustration of a cross-sectional view of a semiconductor package with a heat spreader, a backside metallization (BSM) layer, an interface layer, and a base layer, according to one embodiment.

Described herein are semiconductor packages with backside metallization (BSM) and methods of forming such semiconductor packages. The semiconductor packages described below and methods of forming such semiconductor packages include a heat spreader, a BSM layer, an interface layer, and a base layer, according to some embodiments. In particular, the embodiments described herein enable implementing (or disposing/depositing) a thin BSM layer on a surface (or a backside) of a stacked die unit, a stacked die wafer, and/or an external silicon die (e.g., a high-bandwidth memory (HBM) die) at a unit/die level and/or at a wafer level, where the wafer or the die with the thin BSM layer, at the wafer level, may be coupled (or attached) to the stacked dies as the top die.

As used herein, a "BSM" (or a BSM layer) may refer to a conductive layer (or a stack of conductive layers) formed of one or more conductive materials, including, but are not limited to, titanium (Ti), nickel-vanadium (Ni—V), gold (Au), and/or silver (Ag). Additionally, as used herein, the "BSM" may be referred to as a "BSM stack" when the "BSM" is stacked with one or more additional conductive layers (or materials), including, but are not limited to, silicon (Si), silicon dioxide ($SiO_2$), silicon nitride (SiN), silicon carbon nitride (SiCN), silicon monoxide (SiO), copper (Cu), Cu-nanotechnology-rods (Cu-nano-rods), highly thermal adhesive materials, and/or encapsulation (or mold) materials.

The embodiments described herein allow the semiconductor package to combine (or couple) the BSM on the stacked dies with improved thermal solutions such as solder-based thermal interface materials (TIMs) (STIM), heat spreaders, and/or the like. In the embodiments described below, known good dies may be reconstituted on a carrier as die-to-die placement accuracy may be used to limit the sidewall exposures of the dies during a plasma enhanced chemical vapor deposition (PECVD) process or the like, where the PECVD process may be implemented to dispose the BSM directly on (or over) the top surfaces of the dies. Alternatively, in other embodiments, a mask layer/film may also be used to block the sidewalls of the dies (or stacked dies), where the mask layer thus enables disposing the BSM only on the top surfaces (or zone/region/portion of interests) of the dies. In additional embodiments, an adhesive layer (or material) may be leveraged to protect the sidewalls (or edges) of the dies during the deposition of the BSM.

The embodiments described herein provide improvements to existing packaging solutions by providing improved thermal solutions for multi-chip packages (MCPs) (or the semiconductor package) with one or more BSM stacks. These improved thermal solutions enable implementing (or manufacturing/assembling) the BSM on/over the dies (or the stacked dies), and the STIM-based thermal solutions on/over the BSM, which thereby substantially increases the thermal dissipation of the semiconductor package. As such, these thermal solutions described herein therefore lead to significantly improved performances for the semiconductor packages (and/or the individual dies). For example, in the existing air-cooled solution space, the presence or lack of this improvement described herein may be directly correlated with the overall product design, feasibility, and performance of such semiconductor packages/devices.

Also, the embodiments described below enable a unit level BSM solution that may provide a path to implement external silicon die/stacked dies at a die/unit level with the same BSM process (and/or materials) used for the other selective/respective dies/stacked dies of the semiconductor package. For example, implementing the BSM on singulated dies and on external memory dies enables the use of a single thermal solution for both the singlulated, thin dies and external, larger memory dies (or any other external peripheral dies, core dies, etc.) within the same semiconductor package. For large die/low yield wafers, the embodiments described below also provide a lower-cost alternative to wafer level BSM. Whereas, for external packages, these embodiments improve existing packaging solutions by removing the dependency on external suppliers (or the like) to implement the BSM, thereby removing further assembly roadblocks and providing increased certainty, time-efficiency, and control over the semiconductor packages. As such, with existing technologies mixing various types of dies on a single package, these embodiments described herein enable implementing BSM on all of the dies under the heat spreader (e.g., an integrated heat spreader (IHS)), and thus enabling an improved BSM process (or roadmap) for dis-aggregated and heterogeneous MCPs/semiconductor packages.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with heat spreaders, interface layers, TIMs, BSM layers (or BSM stacked layers), first dies, second dies, substrates, and package substrates.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1B:
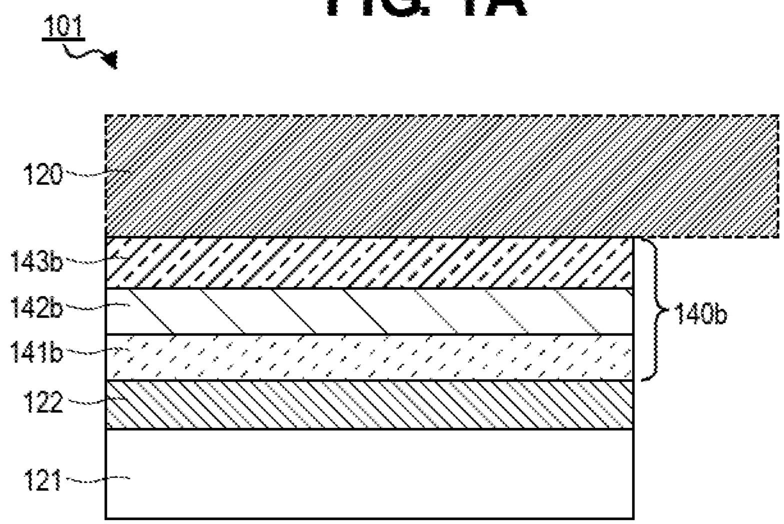
FIG. 1B is an illustration of a cross-sectional view of a semiconductor package with a heat spreader, a BSM layer, an interface layer, and a base layer, according to one embodiment
Figure 1C:
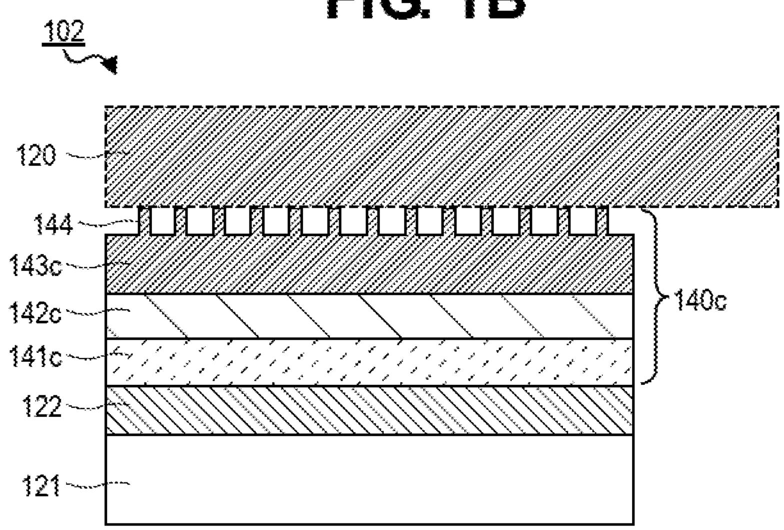
FIG. 1C is an illustration of a cross-sectional view of a semiconductor package with a heat spreader, a BSM layer, an interface layer, and a base layer, according to one embodiment

FIGS. 1A-1C are illustrations of cross-sectional views of portions of a plurality of BSM layers 140*a-c* of a plurality of semiconductor packages 100-102, respectively, in accordance with an embodiment. The BSM layers 140*a-c* described below may be disposed over a stacked die unit, a stacked die wafer, and/or an external die (or the like) at a die/unit level and/or at a wafer level. For example, these BSM layers 140*a-c* may be thinly disposed (or deposited) on/over the top surfaces (or the backside surfaces) of these stacked dies to enable higher conductivity, faster heat dissipation, and improved performance of the respective semiconductor packages 100-102.

Referring now to FIG. 1A, a cross-sectional illustration of a portion of a BSM layer 140*a* of a semiconductor package 100 is shown, in accordance with an embodiment. In an embodiment, the semiconductor package 100 may be a multi-chip package (MCP) or the like, where the MCP may include, but is not limited to, a heat spreader, a TIM, an interface layer, an interposer (or a stiffener, a passive heat spreader, etc.), a plurality of dies (e.g., dies with one or more thicknesses), a substrate (e.g., a high-density package (HDP) substrate), and a package substrate (e.g., a printed circuit board (PCB), a motherboard, etc.). In particular, the semiconductor package 100 may include a heat spreader 120, the BSM layer 140*a*, an interface layer 122, and a base layer 121, according to one embodiment.

As shown in FIG. 1A, in some embodiments, the BSM layer 140*a* may be directly disposed on the interface layer 122, while the interface layer 122 may be directly disposed on the base layer 121. In these embodiments, the BSM layer 140*a* may be directly disposed between the heat spreader 120 and the interface layer 122. Furthermore, the BSM layer 140*a* may further include a plurality of conductive layers 141*a*, 142*a*, and 143*a*, such as a first conductive layer 141*a* (e.g., a Ti layer), a second conductive layer 142*a* (e.g., a Ni—V layer), and a third conductive layer 143*a* (e.g., an Au layer). Note that, while the one BSM layer 140*a* with the three separate conductive layers 141*a*, 142*a*, and 143*a* is shown in FIG. 1A, it is to be appreciated that any number of conductive layers 141*a*, 142*a*, and 143*a* having the same and/or different thicknesses may be implemented to form the BSM layer 140*a* (i.e., in alternative embodiments, the BSM layer 140*a* may include one or two conductive layers, or include four or more conductive layers).

For one embodiment, the base layer 121 may be a layer (or a portion of a layer) that is comprised of, but not limited to, a Si material, a $SiO_2$ material, and/or an encapsulation material. For example, in an embodiment, the base layer 121 may be a bare top surface (or portion) of a silicon die, a bare top surface (or portion) of a stack of silicon dies, and/or the like. Alternatively, in other embodiments, the base layer 121 may be a top surface (or portion) of a dielectric layer, and/or a top surface (or portion) of an encapsulation layer (or mold layer). In the embodiments, where the base layer 121 may be a silicon die and/or a stack of silicon dies, these silicon dies may be a composite die stack, a monolithic silicon die, a thin die (e.g., a thin embedded multi-die interconnect bridge (EMIB)), a satellite die, a high-bandwidth memory (HBM) die, and/or any other die or integrated circuit (IC), such as an electrical device/component.

In some embodiments, the silicon dies may include, but are not limited to, a semiconductor die, an electronic device (e.g., a wireless device), an IC, a central processing unit (CPU), a microprocessor, a platform controller hub (PCH), a memory, and/or a field-programmable gate array (FPGA). A die may have a thin profile (or a low z-height profile) and may be formed from a material such as silicon (or the like), where the die may include circuitry thereon that may be coupled to another die, substrate, and so on. The dies may have the same thicknesses or may have different thicknesses (e.g., a first die may be a thin EMIB with a first thickness, and a second die may be a thicker HBM with a second thickness, where the first thickness of the first die may be less than the second thickness of the second die).

In one embodiment, the interface layer 122 may include a SiN material, a SiO material, a SiCN material, and/or a thermal adhesive material (e.g., alumina, silver, or the like). For some embodiments, the interface layer 122 may be a SiN layer, a SiO layer, a SiCN layer, a thermal adhesive layer, and/or an adhesion promotion layer (or the like). For example, the interface layer 122 may form a permanent bond interface between the base layer 121 and the BSM layer 140*a*. In these embodiments, stacking the BSM layer 140*a* and the interface layer 122 allows for improved (or enhanced) thermal performance to extract (or dissipate) heat from the base layer 121 (or the base die(s)) to the heat spreader 120.

In an additional embodiment, the heat spreader 120 may be disposed over the BSM layer 140*a*, the interface layer 122, and the base layer 121. The heat spreader 120 may be manufactured (or shaped) to include a lid and a plurality of legs (or pedestals), where the lid of the heat spreader 120 may be directly disposed on/over the top surface of the BSM layer 140*a*. In another embodiment, the heat spreader 120 may have any shape based on the desired packaging design/application. In some embodiments, the heat spreader 120 may be a heatsink, an IHS, a heat exchanger, a manifold, a cold plate, and/or any similar thermal solution (or device) that may be used to help transfer the heat from the electrical components of the semiconductor package 100 to the ambient environment (or an additional heat spreader).

In another embodiment, a TIM (e.g., as shown in with the TIM 341 of FIG. 3) may be implemented and stacked with the interface layer 122, the BSM layer 140*a*, and/or the heat spreader 120, where the TIM may be a STIM or the like. For example, the TIM may be disposed between the BSM layer 140*a* and the heat spreader 120 to thermally improve the heat dissipation of the semiconductor package 100. Note that the TIM may be omitted if desired or substituted with any other similar material/layer that may be implemented to couple (or bond/attach) the BSM layer 140*a* and the heat spreader 120.

As described above, according to some embodiments, the BSM layer 140*a* may include the first conductive layer 141*a*, the second conductive layer 142*a*, and the third conductive layer 143*a*. In these embodiments, the BSM layer 140*a* may be implemented by initially disposing the first conductive layer 141*a* directly on the interface layer 122. Respectively, in these embodiments, the second conductive layer 142*a* may be directly stacked on the first conductive layers 141*a*, and the third conductive layer 143*a* may be directly stacked on the second conductive layer 142*a* to form the BSM layer 140*a* with the stack of first, second, and third conductive layers 141*a*, 142*a*, and 143*a*.

In some embodiments, the first conductive layer 141*a* may be a Ti layer (or a layer comprised of Ti or the like), the second conductive layer 142*a* may be a Ni—V layer (or a layer comprised of Ni, V, and/or the like), and the third conductive layer 143*a* may be an Au layer (or a layer comprised of Au or the like). In one embodiment, the first conductive layer 141*a* may have a first thickness that is approximately 500 A-2000 A. In an embodiment, the first thickness of the first conductive layer 141*a* may be approximately or less than 500 A. In one embodiment, the second conductive layer 142*a* may have a second thickness that is approximately 1000 A-4000 A. In an embodiment, the second thickness of the second conductive layer 142*a* may be approximately or less than 1000 A. In one embodiment, the third conductive layer 143*a* may have a third thickness that is approximately 500 A-2000 A. In an embodiment, the third thickness of the third conductive layer 143*a* may be approximately or less than 500 A.

Note that, in some embodiments, the first thickness of the first conductive layer 141*a* may be substantially equal to the third thickness of the third conductive layer 143*a*, where the second thickness of the second conductive layer 142*a* may be greater than the first and third thicknesses of the first and third conductive layers 141*a* and 143*a*. Alternatively, in some embodiments, the first, second, third conductive layers 141*a*, 142*a*, and 143*a* may have substantially the same thicknesses, while, in other embodiments, the first, second, third conductive layers 141*a*, 142*a*, and 143*a* may have different thicknesses. Also note that, in other embodiments, the BSM layer 140*a* may be implemented with a third conductive layer that may be comprised of a Cu material. For example, as shown below in FIGS. 1B-1C, the third conductive layer of the BSM layer 140*a* may be a Cu—Cu bonding layer and/or a Cu-nano-rods layer, rather than an Au layer such as the third conductive layer 143*a*.

Referring now to FIG. 1B, a cross-sectional illustration of a portion of a BSM layer 140*b* of a semiconductor package 101 is shown, in accordance with an embodiment. In an embodiment, the semiconductor package 101 may be substantially similar to the semiconductor package 100 described above in FIG. 1A, with the exception that the BSM layer 140*b* has a third conductive layer 143*b* comprised of a Cu layer (or a layer comprised of Cu or any similar conductive material(s)). Whereas, the third conductive layer 143*a* of the BSM layer 140*a* is comprised of an Au material as described above in FIG. 1A, the third conductive layer 143*b* of the BSM layer 140*b* of FIG. 1B may be comprised of a Cu material or any similar conductive/metallic material.

Likewise, as stated above, the components of the semiconductor package 101 may be substantially similar to the components of the semiconductor package 100 described above in FIG. 1A. That is, in one embodiment, the semiconductor package 101 may include a heat spreader 120, an interface layer 122, and a base layer 121 that are substantially similar to the heat spreader 120, the interface 122, and the base layer 121 described above in FIG. 1A.

As shown in FIG. 1B, in some embodiments, the BSM layer 140*b* may be directly disposed on the interface layer 122, while the interface layer 122 may be directly disposed on the base layer 121. In these embodiments, the BSM layer 140*b* may be directly disposed between the heat spreader 120 and the interface layer 122. Alternatively, as described above, a TIM may be additionally implemented and stacked with the interface layer 122, the BSM layer 140*b*, and/or the heat spreader 120 to thermally improve the heat dissipation of the semiconductor package 101. Note that the TIM may be omitted if desired or substituted with any other similar material/layer that may be implemented to couple (or bond/attach) the BSM layer 140*b* and the heat spreader 120. Furthermore, the BSM layer 140*b* may further include a plurality of conductive layers 141*b*, 142*b*, and 143*b*, such as a first conductive layer 141*b* (e.g., a Ti layer), a second conductive layer 142*b* (e.g., a Ni—V layer), and a third conductive layer 143*b* (e.g., a Cu—Cu bonding layer), where the BSM layer 140*b* may implement the Cu layer to facilitate, for example, the Cu—Cu bonding between the base layer 121 (or the base die(s)) and the heat spreader 120.

Referring now to FIG. 1C, a cross-sectional illustration of a portion of a BSM layer 140*c* of a semiconductor package 102 is shown, in accordance with an embodiment. In an embodiment, the semiconductor package 102 may be substantially similar to the semiconductor packages 100-101 described above in FIGS. 1A-1B, with the exception that the BSM layer 140*c* has a third conductive layer 143*c* with a plurality of conductive bumps 144 that are comprised of Cu-nano-rods (or the like). Whereas, the third conductive layer 143*a* of the BSM layer 140*a* is comprised of an Au material as described above in FIG. 1A, and the conductive layer 143*b* of the BSM layer 140*b* is comprised of a Cu material as described above in FIG. 1B, the third conductive layer 143*c* of the BSM layer 140*c* of FIG. 1C may be comprised of a Cu material or any similar conductive/metallic material that further includes conductive bumps 144 (or conductive nano-rods).

Likewise, as stated above, the components of the semiconductor package 102 may be substantially similar to the components of the semiconductor packages 100-101 described above in FIGS. 1A-1B. That is, in one embodiment, the semiconductor package 102 may include a heat spreader 120, an interface layer 122, and a base layer 121 that are substantially similar to the heat spreader 120, the interface 122, and the base layer 121 described above in FIGS. 1A-1B.

Furthermore, as shown in FIG. 1C, for some embodiments, the BSM layer 140*c* may be directly disposed on the interface layer 122, while the interface layer 122 may be directly disposed on the base layer 121. In these embodiments, the BSM layer 140*c* may be directly disposed between the heat spreader 120 and the interface layer 122. Alternatively, as described above, a TIM may be additionally implemented and stacked with the interface layer 122, the BSM layer 140*c*, and/or the heat spreader 120 to thermally improve the heat dissipation of the semiconductor package 102. Note that the TIM may be omitted if desired or substituted with any other similar material/layer that may be implemented to couple (or bond/attach) the BSM layer 140*c* and the heat spreader 120.

Furthermore, the BSM layer 140*c* may further include a plurality of conductive bumps 144 and a plurality of conductive layers 141*c*, 142*c*, and 143*c*, such as a first conductive layer 141*c* (e.g., a Ti layer), a second conductive layer 142*c* (e.g., a Ni—V layer), and a third conductive layer 143*c* with the conductive bumps 144 (e.g., a Cu layer with Cu-nano-rods), where the BSM layer 140*c* may implement the Cu layer with Cu-nano-rods to facilitate, for example, the Cu—Cu bonding between the base layer 121 (or the base die(s)) and the heat spreader 120. In these embodiments, the conductive bumps 144 may be a plurality of Cu-nano-rods that vertically extend on/over the top surface of the third conductive layer 143*c*. In one embodiment, these conductive bumps 144 may include any desired shape having substantially the same thicknesses, including shapes such as rods (or nano-rods), rectangular, oval, circular, or the like.

Note that the semiconductor packages 100-102 of FIGS. 1A-1C may include fewer or additional packaging components based on the desired packaging design.

Figure 2:
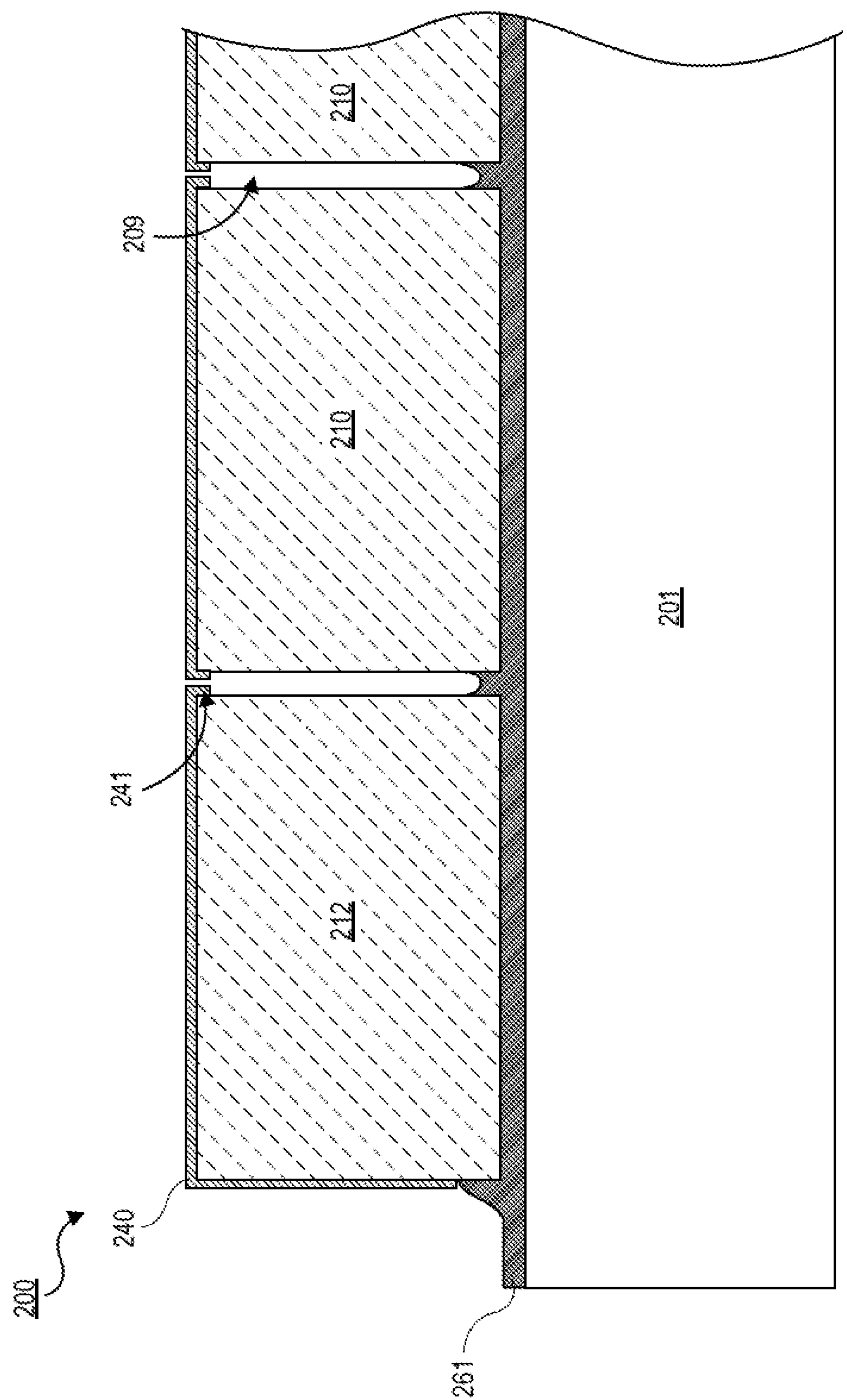
FIG. 2 is an illustration of a cross-sectional view of a semiconductor package with a plurality of dies, a BSM layer, an adhesive layer, and a carrier, according to one embodiment.

Referring now to FIG. 2, a cross-sectional illustration of a portion of a semiconductor package 200 is shown, in accordance with an embodiment. In particular, FIG. 2 may be an illustration of a portion of the semiconductor package 200 during the assembly process at the die/unit level (or the wafer level). For some embodiments, the semiconductor package 200 may include a plurality of dies 210 and 212, a BSM layer 240, an adhesive layer 261, and a carrier 201, according to one embodiment. The semiconductor package 200 may be substantially similar to the semiconductor packages 100-102 described above in FIGS. 1A-1C. Likewise, the components of the semiconductor package 200 may be substantially similar to the components of the semiconductor packages 100-102 described above in FIGS. 1A-1C. As such, the dies 210 and 212 and the BSM layer 240 may be substantially similar to the materials (or portion) of the base layer 121 (or the base dies) and the BSM layer 140*a-c* described above in FIGS. 1A-1C.

Accordingly, in one embodiment, the semiconductor package 200 may include the plurality of dies 210 and 212 disposed over the carrier 201, where the dies 210 and 212 may be coupled onto the carrier 201 with the adhesive layer 261. As shown in FIG. 2, the dies 210 and 212 may be positioned over the carrier 201 with gaps 209 (or die-to-die spacings), where the gaps 209 may have a width of approximately 50 um-90 um. In these embodiments, the BSM layer 240 may be deposited over the top surfaces of the dies 210 and 212, where the BSM layer 240 may have an overhang 241 (or slight overhang) on the top corner edges of the dies 210 and 212. For some embodiments, the overhang 241 may be a slight (or a minimal) portion of the BSM layer 240 that overhangs on the corner edges of the top surfaces of the dies 210 and 212. In these embodiments, the slight overhang 241 may have a thickness (or a slight thickness) of approximately 50 um-75 um based on (or as a result of) the slight gap 209 between the dies 210 and 212. That is, as the dies 210 and 212 are positioned closer to each other over the carrier 201 and thus the gaps 209 in between such dies 210 and 212 are shortened (or reduced), the overhang 241 of the BSM layer 240 may also be respectively shortened/reduced as the portions (or the thicknesses) of the BSM layer 240 disposed on/over the top corner edges of the dies 210 and 212 are shortened due to the shadowing caused by the top corner edges of the dies 210 and 212.

In some embodiments, the carrier 201 may be a glass carrier (e.g., a temporary circular glass carrier or the like), a rigid carrier (e.g., a stainless steel carrier or the like), and/or any similar flat, rigid carrier/substrate. Furthermore, in an embodiment, the adhesive layer 261 may be disposed directly on the top surface of the carrier 201. The dies 210 and 212 may be coupled (or adhesively bonded/attached) to the carrier 201 with the adhesive layer 261, where the adhesive layer 261 may have portions filled in between the outer sidewalls (or edges) of the respective dies 210 and 212. For example, the adhesive layer 261 may be cured to bond (or attach) the dies 210 and 212 onto the carrier 201 with a heating process or the like.

Note that, in some embodiments, these portions of the adhesive layer 261 that are disposed in between the dies 210 and 212 may further extend vertically to substantially cover the outer sidewalls of the dies 210 and 212 (e.g., these portions of the adhesive layers 261 may have top surfaces that are substantially coplanar to top surfaces of the dies 210 and 212). In these embodiments, the adhesive layer 261 may be implemented to cover/protect the outer sidewalls of the dies 210 and 212, thereby substantially eliminating (or reducing) the overhang 241 of the BSM layer 240 and only having the BSM layer 240 on the top surfaces of the dies 210 and 212. Alternatively, note that, in another embodiment, an underfill material may be disposed over the adhesive layer 261 and between the outer sidewalls of the dies 210 and 212, where the underfill material may extend vertically (or be sandwiched) between the dies 210 and 212 to cover/protect the outer sidewalls of the dies 210 and 212. This underfill material may thus be implemented to substantially eliminate (or reduce) the overhang 241 of the BSM layer 240 and only having the BSM layer 240 on the top surfaces of the dies 210 and 212. Furthermore, after the deposition of the BSM layer 240, the adhesive layer 261 or the underfill material disposed between the outer sidewalls of the dies 210 and 212 may then be removed with a laser process, an etching process, or the like. Likewise, in another embodiment, a laser process (or the like) may be implemented to remove (or eliminate) the overhang 241 of the BSM layer 240, when the adhesive material 261 or the underfill material is not disposed (or sandwiched) between the outer sidewalls of the dies 210 and 212.

As described above, the BSM layer 240 may be substantially similar to the BSM layer 140 described above in FIGS. 1A-1C. The BSM layer 240 may be implemented on the dies 210 and 212 at the die/unit level and/or the wafer level. For example, at the unit level, the BSM layer 240 may be directly disposed (or deposited) on/over the dies 210 and 212 as singulated dies or stacked die(s) units with a physical vapor deposition (PVD) sputtering process or the like. In one embodiment, the dies 210 and 212 may be temporarily disposed over the carrier 201, where the dies 210 and 212 may be positioned and separated by the gaps 209.

For some embodiments, the dies 212 may be positioned on/over the outer edges/regions of the carrier 201, while the dies 210 may be positioned on/over the inner region of the carrier 201 and in between (or surrounded by) the dies 212. In these embodiments, based on the substantially small widths of the gaps 209 (as described above) between the dies 210 and 212, the corner edges of the top surfaces of the dies 210 and 212 may substantially overshadow (or shadow/cover) the outer sidewalls of the respective dies 210 and 212. For example, this overshadowing may be leveraged to subsequently enable disposing the BSM layer 240 only on the top surfaces of the dies 210 and 212 and thereby substantially eliminating (or reducing) the overhang 241 on/over the respective dies 210 and 212. Meanwhile, in these embodiments, the dies 212 may be implemented as the outer dies, where the BSM layer 240 may be disposed on the top surfaces and the respective outer sidewall(s) of the dies 212 (i.e., these respective outer sidewall(s) of the dies 212 are not adjacent to the other die(s)). Note that, as the outer dies, the dies 212 may be removed (or cutout/lasered out) in a subsequent processing step with a laser/slicing/cutting process or the like.

Additionally, in one embodiment, an interface layer may be disposed directly on the exposed (or bare) top surfaces of the dies 210 and 212 (e.g., as shown above with the interface layer 122 of FIGS. 1A-1C). The interface layer may be disposed over the dies 210 and 212, the adhesive layer 261, and the carrier 201, where the interface layer may be overfilled and have a top surface that may be positioned above the top surfaces of the dies 210 and 212. As such, the interface layer may be etched down to the desired thickness to form a substantially planarized (or flat) surface above the top surfaces of the dies 210 and 212.

For one embodiment, the BSM layer 240 may then be directly disposed (or deposited) over the top surfaces of the dies 210 and 212. As such, the interface layer may be implemented to thermally/conductively couple the dies 210 and 212 to the BSM layer 240. Furthermore, as described above in FIGS. 1A-1C, the BSM layer 240 may include a first conductive layer such as the Ti layer, a second conductive layer such as the Ni—V layer, and a third conductive layer such as the Au layer, the Cu layer, and/or the Cu layer with the Cu-nano-rods. In one embodiment, the BSM layer 240 may be planarized (or polished) and thus the top surface of the BSM layer 240 (e.g., the third conductive layer of the BSM layer 240) may be substantially parallel to the top surfaces of the dies 210 and 212. Furthermore, in some embodiments, the dies 210 and 212 may be cut (or sliced/lasered), detached from the adhesive layer 261 and the carrier 201 with a temporary laser debonding solution or the like, and subsequently cleaned and picked-and-placed to form the respective stacked die(s) of the semiconductor package 200. Additionally, as described above, this process flow implementing the BSM layer 240 may be disposed on any incoming die type, including, but is not limited to, a monolithic silicon die, a composite die, a stack of dies with/without an encapsulation material (e.g., a mold layer), a thin die (e.g., an EMIB die), a satellite die, a thicker die (e.g., a HBM die), and/or any other electrical component (e.g., discrete components, etc.). Accordingly, the BSM layer 240 may be disposed directly on a top surface of a first die such as one die of the dies 210, and, subsequently, the BSM layer 240 may also be disposed directly on a top surface of a second die such as an external die (e.g., a HBM die) implementing the same process flow used for the first die.

Note that the semiconductor package 200 may include fewer or additional packaging components based on the desired packaging design.

Figure 3:
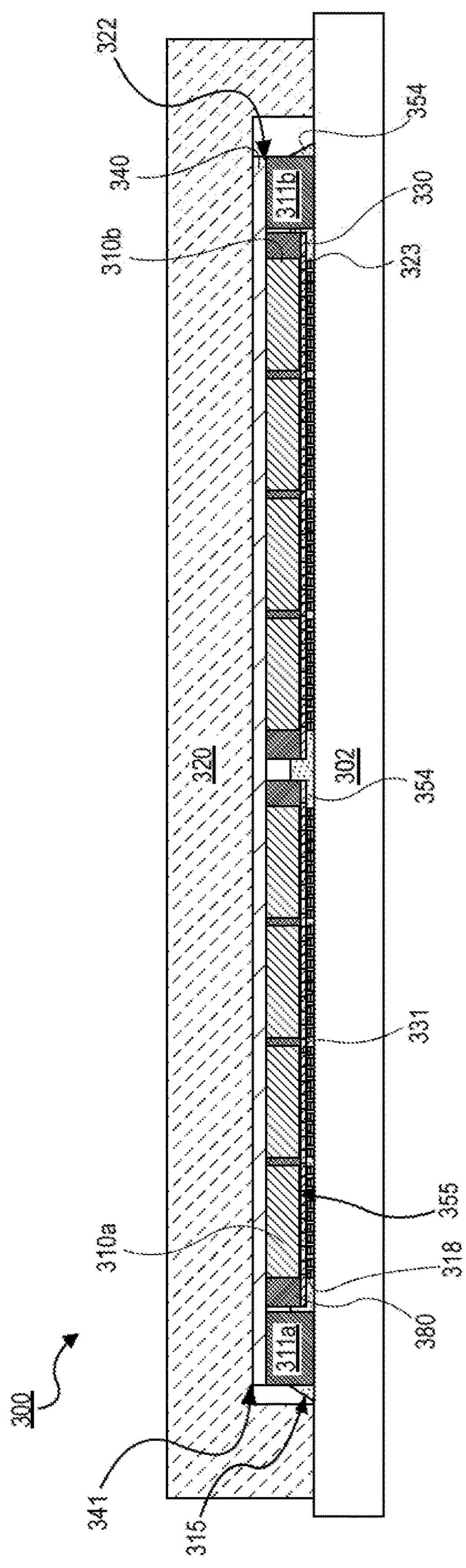
FIG. 3 is an illustration of a cross-sectional view of a semiconductor package with a heat spreader, a BSM layer, a plurality of first dies, a plurality of second dies, a plurality of substrates, and a package substrate, according to one embodiment.

Referring now to FIG. 3, a cross-sectional illustration of a semiconductor package 300 is shown, in accordance with an embodiment. In an embodiment, the semiconductor package 300 may include a heat spreader 320, a BSM layer 340, an interface layer 322, a plurality of first dies 310*a-b*, a plurality of second dies 311*a-b*, a plurality of substrates 330, and a package substrate 302, according to one embodiment. For one embodiment, the semiconductor package 300 may be a MCP or the like, where the semiconductor package 300 may be substantially similar to the semiconductor packages 100-102 and 200 described above in FIGS. 1A-1C and 2.

In one embodiment, a plurality of substrates 330 may be disposed over a package substrate 302. For one embodiment, the package substrate 302 may include, but is not limited to, a package, a substrate, a PCB, and/or a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer may be a photosensitive dielectric layer. For one embodiment, the PCB 302 may include a plurality of conductive layers, which may further include copper (or metallic) traces, lines, pads, vias, via pads, holes, and/or planes.

As shown in FIG. 3, the substrates 330 may be disposed over the package substrate 302, where the substrates 330 may be conductively coupled to the package substrate 302 with a plurality of solder balls 323. Note that, while two substrates 330 are shown in FIG. 3, it is to be appreciated that any number of substrates 330 may be disposed on/over and coupled to the package substrate 302 (e.g., one substrate 330 may be implemented with a larger footprint (or an x-y area) to couple the package substrate 302 to the first dies 310*a-b*).

In one embodiment, the substrates 330 may be a high-density organic substrate such as a HDP substrate or the like. For one embodiment, the substrates 330 may include a plurality of redistribution layers (RDLs) comprised of traces with L/S of approximately or less than 2/2 um (i.e., fine/ultrafine traces), lithographically-defined vias, zero-misalignment vias, and/or via pads with fine (or ultrafine) pitches. The substrates 330 may be a silicon substrate having increased (or high) input/output (I/O) density and bandwidth for the communication between the first dies 310*a-b* and the package substrate 302. In one embodiment, the substrates 330 may have a thickness of approximately 10 um to 200 um, or, in an alternative embodiment, a thickness of approximately or less than 10 um.

In one embodiment, the substrates 330 may have a plurality of conductive pads 318 and a plurality of conductive interconnects 331. The conductive pads 318 may be disposed on the bottom surfaces of the substrates 330. The conductive pads 318 may be a plurality of ball-grid array (BGA) pads or the like. The conductive interconnects 331 of the substrates 330 may include conductive vias, traces, lines, pads, or the like. For example, the conductive interconnects 331 may be directly coupled to the conductive pads 318, where the solder balls 323 may conductively couple the first conductive pads 318 of the substrates 330 to the top surface of the package substrate 302. As such, in some embodiments, the conductive interconnects 331 of the substrates 330 may communicatively couple the package substrate 302 to a plurality of first dies 310*a-b*.

The first dies 310*a-b* may be disposed over the respective substrates 330, where the first dies 310*a* are positioned on the top surface of one of the substrates 330, and the first dies 310*b* are positioned on the top surface of another of the substrates 330. The first dies 310*a-b* may be substantially similar to the materials/portion (e.g., Si) of the base layer 121 and the dies 210 described above in FIGS. 1A-1C and 2. For one embodiment, the first dies 310*a-b* may be a thin die such as a composite die stack, a monolithic silicon die, and/or any other thin die (e.g., a thin EMIB). For one embodiment, the first dies 310*a* may have a thickness (or z-height) that is substantially equal to a thickness of the first dies 310*b*. In some embodiments, the first dies 310*a-b* may include, but are not limited to, a semiconductor die, an electronic device (e.g., a wireless device), an IC, a CPU, a microprocessor, a PCH, a memory, and/or a FPGA. The first dies 310*a-b* may have a thin profile (or a low z-height profile), be formed from a material such as silicon (or the like), and have circuitry thereon that is to be coupled to the substrates 330 and/or any other dies, substrates, and so on.

In some embodiments, an encapsulation layer 380 may be disposed over the first dies 310*a-b* and the substrates 330. In one embodiment, the encapsulation layer 380 may include one or more encapsulation materials such as a mold material, an underfill material, a filler material, any similar material(s), and/or any combination thereof. For one embodiment, the encapsulation layer 380 may include an epoxy (e.g., a soft epoxy, a stiff epoxy, opaque epoxy, etc.) with one or more filler materials. In an embodiment, the encapsulation layer 380 may be compression molded, laminated, or the like. For example, the encapsulation layer 380 may be planarized as the top surface of the encapsulation layer 380 may be substantially coplanar to the top surfaces of the first dies 310*a-b*, where the encapsulation layer 380 may also be disposed between the outer edges of the first dies 310*a-b*.

Also, the encapsulation layer 380 may be disposed over an underfill material 355 (or an underfill layer). In one embodiment, the underfill material 355 may be disposed over the substrates 330, where the underfill material 355 is disposed between the top surface of the substrates 330 and the bottom surfaces of the first dies 310*a-b*. The underfill material 355 may be surrounded (or embedded) with portions of the encapsulation layer 380. In some embodiments, the underfill material 355 may surround conductive pads and solder balls (or solder bumps) formed between the first dies 310*a-b* and the respective substrates 330.

In some embodiments, the interface layer 322 may be disposed over the top surfaces of the first dies 310*a-b*, the second dies 311*a-b*, and the encapsulation layer 380. The interface layer 322 may be substantially similar to the interface layer 122 described above in FIGS. 1A-1C. The interface layer 322 may be disposed over the first dies 310*a-b* and/or the second dies 311*a-b*. Note that the interface layer 322 may be a layer comprised of conductive and/or thermal materials (e.g., SiN, SiO, SiCN, or the like), and having a desired thickness (or thicknesses) based on the packaging design and/or application.

For some embodiments, the interface layer 322 may be formed of one or more different conductive/thermal materials, such as SiN, SiO, SiCN or the like, for improved thermal conductivity. For example, the interface layer 322 may provide improved warpage control by implementing similar CTE materials for both of the stacked interface layer 322, the first dies 310*a-b*, and/or the second dies 311*a-b*. In one embodiment, the interface layer 322 may be directly bonded (or attached/coupled) to the encapsulation layer 380 and the respective first dies 310*a-b* and/or the second dies 311*a-b* with the interface layer 322. For example, the interface layer 322 may be directly (or permanently) coupled/attached to the respective first dies 310*a-b* and second dies 311*a-b* at the wafer level or the die level. For one embodiment, the interface layer 322 may be attached permanently at the wafer level and/or the die level by directly bonding (or leveraging) the materials of the first dies 310*a-b* and the second dies 311*a-b* to the materials of the interface layer 322 (e.g., SiN, SiO, SiCN, etc.) without requiring any alignment features.

In one embodiment, the interface layer 322 may include a SiN material, a SiO material, a SiCN material, and/or a thermal adhesive material (e.g., alumina, silver, or the like). For some embodiments, the interface layer 322 may be a SiN/SiO/SiCN layer, a thermal adhesive layer, and/or an adhesion promotion layer. For example, the interface layer 322 may create a permanent bond interface between the first dies 310*a-b*, the second dies 311*a-b*, the encapsulation layer 380, and/or the BSM layer 340 as described herein. In these embodiments, stacking the BSM layer 340 and the interface layer 322 allows for improved (or enhanced) thermal performance to extract (or dissipate) heat from the respective first and second dies 310*a-b* and 311*a-b* (or the base dies) due to (i) the reduction of needed thickness of the encapsulation layer 380 and (ii) low contact resistance of SiN, SiO, SiCN, or the like.

In some embodiments, the interface layer 322 may have a first thickness and a second thickness. For example, the first thickness of the interface layer 322 may be defined between the top surfaces of the first dies 310*a-b* and the bottom surface of the interface layer 322, while the second thickness of the interface layer 322 may be defined between the bottom surface of the interface layer 322 and the top surface of the encapsulation layer 380 (e.g., a top surface of an undercut/dished/curved portion of the encapsulation layer 380 disposed between one of the first dies 310*a* and another of the first dies 310*a*). In one embodiment, the first thickness of the interface layer 322 may be less than the second thickness of the interface layer 322 (e.g., the difference in thicknesses of the interface layer 322 may be due to dishing post grinding/polishing of the encapsulation layer 380). For one embodiment, the second thickness of the interface layer 322 may be approximately 2 um-3 um. In another embodiment, the second thickness of the interface layer 322 may be approximately or less than 3 um. In an embodiment, the first thickness of the interface layer 322 may be approximately or less than 2 um.

Additionally, as shown in FIG. 3, the second dies 311*a-b* may be disposed on the package substrate 302. The second dies 311*a-b* may be directly coupled to the top surface of the package substrate 302. In some embodiments, as shown in FIG. 3, the second dies 311*a-b* may be positioned adjacent to the outer edges of the respective substrates 330 and encapsulation layer 380. The second dies 311*a-b* may have a thickness that is greater than a thickness of the first dies 310*a-b*. For some embodiments, the second dies 311*a-b* may have a thickness that is substantially equal to a thickness of the combined thicknesses of the respective interface layer 322, the respective first dies 310*a-b*, and the respective substrates 330 with the conductive pads 318 and the solder balls/bumps 323. For example, the thickness of the stacked interface layer 322, the first dies 310*a-b*, and the substrates 330 may be approximately 100 um to 260 um or, in alternative example, may be approximately or less than 100 um. The thickness (or thicknesses) of the interface layer 322 may be manufactured based on the thicknesses of the first and second dies 310*a-b* and 311*a-b* (i.e., the approximate thickness of the interface layer 322 may be selected based on the thickness of the first dies 310*a-b* and the second dies 311*a-b*).

For one embodiment, the second die 311*a* may have a thickness that is substantially equal to a thickness of the second die 311*b*. As such, in these embodiments, the top surfaces of the second dies 311*a-b* may be substantially coplanar to the top surfaces of the first dies 310*a-b* and/or the encapsulation layer 380. For one embodiment, the second dies 311*a-b* may be a satellite die, a HBM die, and/or any other die or electrical device/component with a thickness that may be greater than the thickness of the first dies 310*a-b*. Furthermore, in some embodiments, the second dies 311*a-b* may include, but are not limited to, a semiconductor die, an electronic device (e.g., a wireless device), an IC, a CPU, a microprocessor, a PCH, a memory (e.g., a HBM die), and/or a FPGA. The second dies 311*a-b* may be formed from a material such as silicon (or the like) and have circuitry thereon that is to be coupled onto the package substrate 302.

In some embodiments, the BSM layer 340 may be disposed over the interface layer 322, the first and second dies 310*a-b* and 311*a-b*, the encapsulation layer 380, and the package substrate 302. The BSM layer 340 may be substantially similar to the BSM layers 140*a-c* and 240 described above in FIGS. 1A-1C and 2. Furthermore, as described above in FIGS. 1A-1C and 2, the BSM layer 340 may include a first conductive layer such as the Ti layer, a second conductive layer such as the Ni—V layer, and a third conductive layer such as the Au layer, the Cu layer, and/or the Cu layer with the Cu-nano-rods. The BSM layer 340 may be directly disposed and coupled onto the top surface of the interface layer 322, where the first conductive layer of the BSM layer 340 may be coupled directly to the top surface of the interface layer 322. Note that, while one BSM layer 340 is shown in FIG. 3, it is to be appreciated that any number of BSM layers 340 may be disposed and coupled onto the interface layer 322. For example, one BSM layer 340 may be disposed only over the second die 311*a*, the interface layer 322, and the first dies 310*a*, while another, separate BSM layer 340 may be disposed over the second die 311*b*, the interface layer 322, and the first dies 310*b*, where the two BSM layers 340 may have the same thickness or different thicknesses.

In one embodiment, a heat spreader 320 may be disposed over the BSM layer 340, the interface layer 322, the first and second dies 310*a-b* and 311*a-b*, the substrates 330, and the package substrate 302. The heat spreader 320 may be manufactured (or shaped) to include a lid and a plurality of legs (or pedestals), where the lid of the heat spreader 320 (or the bottom surface of the lid of the heat spreader 320) may be directly disposed on the top surface of the BSM layer 340 (or the third conductive layer of the BSM layer 340), and the legs of the heat spreader 320 may be directly disposed on the top surface of the package substrate 302. In some embodiments, the heat spreader 320 may be a heatsink, an IHS, a heat exchanger, a manifold, a cold plate, and/or any similar thermal solution (or device) that may be used to help transfer the heat from the electrical components of the semiconductor package 300 to the ambient environment (or an additional heat spreader). In one embodiment, a TIM 341 may be implemented and stacked with the interface layer 322, the BSM layer 340, and/or the heat spreader 320, where the TIM 341 may be a STIM or the like. For example, in one embodiment, the TIM 341 may be disposed between the BSM layer 340 and the heat spreader 320 to thermally improve the heat dissipation of the semiconductor package 300. Note that the TIM 341 may be omitted if desired or any other similar material/layer may be implemented to couple (or bond/attach) the BSM layer 340 and the heat spreader 320.

For one embodiment, the heat spreader 320 may enclose (or form) a cavity 315 that surrounds the BSM layer 340, the interface layer 322, the first and second dies 310*a-b* and 311*a-b*, and the substrates 330. In an embodiment, an underfill material 354 may be disposed within the cavity 315 of the heat spreader 320 and on the top surface of the package substrate 302, where the underfill material 354 may partially/fully surround the second dies 311*a-b*, the encapsulation layer 380, and the substrates 330 with the conductive pads 318 and the solder balls 323. The underfill 354 may be substantially similar to the underfill material 355.

Note that the semiconductor package 300 may include fewer or additional packaging components based on the desired packaging design.

Figure 4:
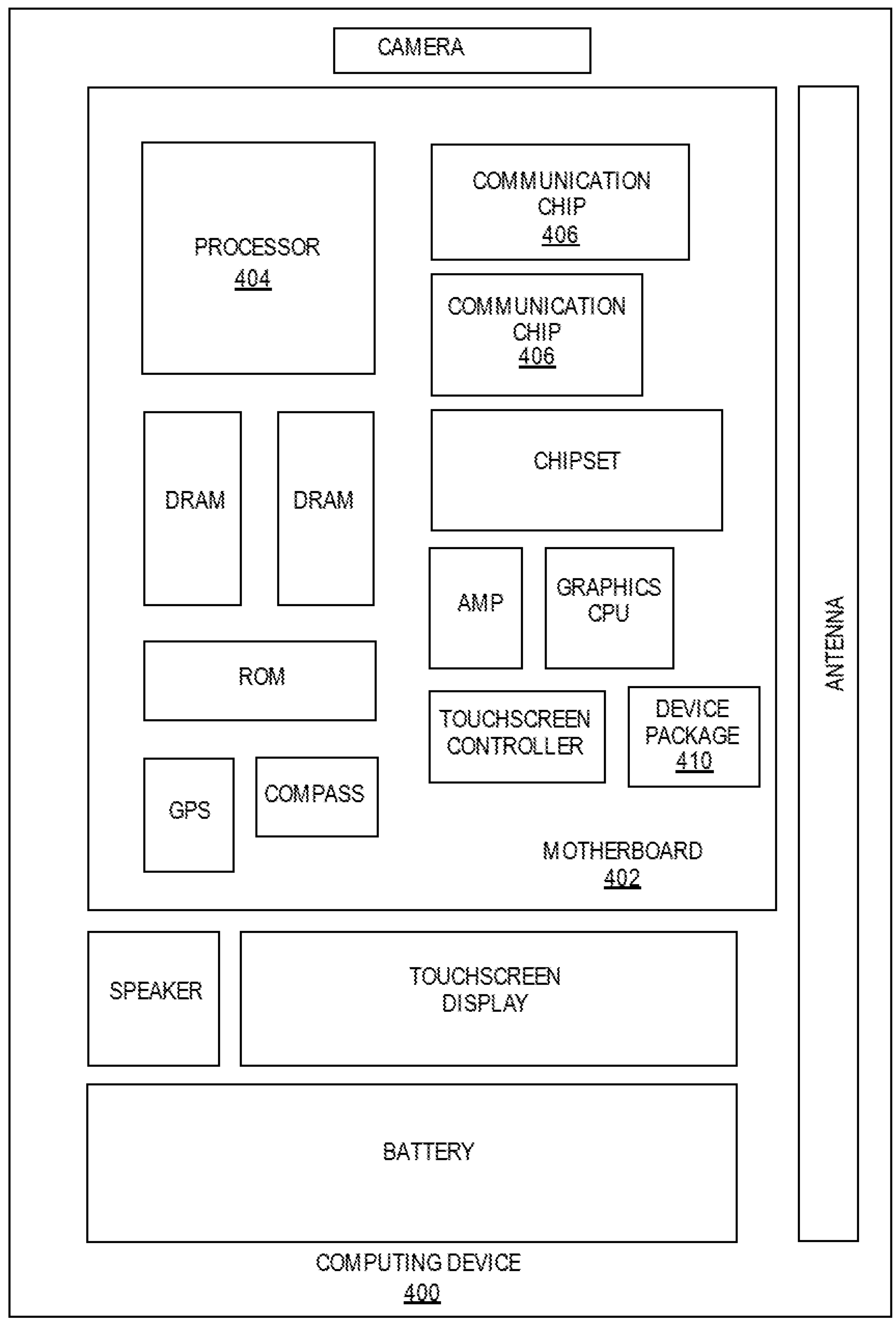
FIG. 4 is an illustration of a schematic block diagram illustrating a computer system that utilizes a semiconductor package with a BSM layer, according to one embodiment.

FIG. 4 is an illustration of a schematic block diagram illustrating a computer system 400 that utilizes a device package 410 (or a semiconductor package) with a BSM layer, a heat spreader, an interface layer, a plurality of first and second dies, a substrate, and a package substrate, according to one embodiment. FIG. 4 illustrates an example of computing device 400. Computing device 400 houses a motherboard 402. Motherboard 402 may include a number of components, including but not limited to processor 404, device package 410 (or semiconductor package), and at least one communication chip 406. Processor 404 is physically and electrically coupled to motherboard 402. For some embodiments, at least one communication chip 406 is also physically and electrically coupled to motherboard 402. For other embodiments, at least one communication chip 406 is part of processor 404.

Depending on its applications, computing device 400 may include other components that may or may not be physically and electrically coupled to motherboard 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 406 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 406 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

Processor 404 of computing device 400 includes an integrated circuit die packaged within processor 404. Device package 410 may be a semiconductor package, a MCP package, or the like. Device package 410 may include, but is not limited to, a substrate, a package substrate, and/or a PCB. In one embodiment, device package 410 may include a semiconductor package that may be substantially similar to the semiconductor packages 100-102 and 200 of FIGS. 1A-1C and 2 described herein. Device package 410 may include integrating/disposing BSM layer(s) directly on/over stacked dies as described herein (e.g., as illustrated and described above with the BSM layers 140*a-c*, 240, and 340 of FIGS. 1A-1C, 2, and 3)—or any other components from the figures described herein.

Note that device package 410 may be a single component/device, a subset of components, and/or an entire system, as the materials, features, and components may be limited to device package 410 and/or any other component of the computing device 400 that may need the BSM layers stacked directly on the dies as described herein (e.g., the motherboard 402, the processor 404, and/or any other component of the computing device 400 that may need the embodiments of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 406 also includes an integrated circuit die packaged within the communication chip 406. For some embodiments, the integrated circuit die of the communication chip 406 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: plurality of first dies on a substrate; an interface layer over the plurality of first dies; a BSM layer directly on the interface layer, wherein the BSM layer includes a first conductive layer, a second conductive layer, and a third conductive layer; and a heat spreader over the BSM layer, wherein the first conductive layer of the BSM layer is directly coupled to the interface layer, and wherein the third conductive layer of the BSM layer is directly coupled to the heat spreader.

In example 2, the subject matter of example 1 can optionally include that a bottom surface of the first conductive layer is directly on a top surface of the interface layer, wherein the second conductive layer is directly between the first and third conductive layers, wherein a bottom surface of the heat spreader is directly on a top surface of the third conductive layer, and wherein the interface layer couples the plurality of first dies to the BSM layer.

In example 3, the subject matter of examples 1-2 can optionally include that the first conductive layer of the BSM layer includes a Ti material.

In example 4, the subject matter of examples 1-3 can optionally include that the second conductive layer of the BSM layer includes a Ni—V material.

In example 5, the subject matter of examples 1-4 can optionally include the third conductive layer of the BSM layer includes an Au material.

In example 6, the subject matter of examples 1-5 can optionally include the third conductive layer of the BSM layer includes a Ag material or a Cu material.

In example 7, the subject matter of examples 1-6 can optionally include that the Cu material of the third conductive layer includes a first Cu layer or a second Cu layer, wherein the second Cu layer has a plurality of conductive bumps, and wherein the plurality of conductive bumps are a plurality of copper nano bumps.

In example 8, the subject matter of examples 1-7 can optionally include an encapsulation layer over the substrate, wherein the encapsulation layer surrounds the plurality of first dies; a plurality of second dies on a package substrate, wherein the substrate is on the package substrate, wherein the plurality of second dies have top surfaces that are substantially coplanar to top surface of the plurality of first dies, wherein the plurality of second dies are adjacent to outer edges of the plurality of first dies, the substrate, and the encapsulation layer, wherein the substrate conductively couples the plurality of first dies to the package substrate, wherein the BSM layer and the interface layer are respectively over the plurality of first and second dies, wherein the heat spreader includes a TIM that thermally couples the BSM layer to the heat spreader, wherein the heat spreader is over the plurality of first and second dies, the BSM layer, the interface layer, the substrate, and the package substrate, wherein the heat spreader includes a lid and a plurality of legs, wherein the lid of the heat spreader is directly on a top surface of the TIM or a top surface of the BSM layer, and wherein the plurality of legs of the heat spreader are directly on a top surface of the package substrate; and an underfill material on the top surface of the package substrate, wherein the underfill material surrounds portions of the plurality of second dies, the encapsulation layer, and the substrate.

In example 9, the subject matter of examples 1-8 can optionally include that wherein the interface layer includes a SiN material, a SiO material, a SiCN, or a thermal adhesive material.

In example 10, the subject matter of examples 1-9 can optionally include that the plurality of first dies have a first thickness that is less than a second thickness of the plurality of second dies, wherein the plurality of second dies include a HBM die, and wherein the TIM is a STIM.

Example 11 is a method to form a semiconductor package, comprising: disposing a plurality of first dies on a substrate; disposing an interface layer over the plurality of first dies; disposing a BSM layer directly on the interface layer, wherein the BSM layer includes a first conductive layer, a second conductive layer, and a third conductive layer; and disposing a heat spreader over the BSM layer, wherein the first conductive layer of the BSM layer is directly coupled to the interface layer, and wherein the third conductive layer of the BSM layer is directly coupled to the heat spreader.

In example 12, the subject matter of example 11 can optionally include that disposing the first conductive layer directly on a top surface of the interface layer; disposing the second conductive layer directly on the first conductive layer; and disposing the third conductive layer directly on the second conductive layer, wherein the second conductive layer is directly in between the first and third conductive layers, wherein a bottom surface of the heat spreader is directly on a top surface of the third conductive layer, and wherein the interface layer couples the plurality of first dies to the BSM layer.

In example 13, the subject matter of examples 10-12 can optionally include that the first conductive layer of the BSM layer includes a Ti material.

In example 14, the subject matter of examples 10-13 can optionally include that the second conductive layer of the BSM layer includes a Ni—V material.

In example 15, the subject matter of examples 10-14 can optionally include that the third conductive layer of the BSM layer includes an Au material.

In example 16, the subject matter of examples 10-15 can optionally include that the third conductive layer of the BSM layer includes an Ag material or a Cu material.

In example 17, the subject matter of examples 10-16 can optionally include that the Cu material of the third conductive layer includes a first Cu layer or a second Cu layer, wherein the second Cu layer has a plurality of conductive bumps, and wherein the plurality of conductive bumps are a plurality of copper nano bumps.

In example 18, the subject matter of examples 10-17 can optionally include disposing an encapsulation layer over the substrate, wherein the encapsulation layer surrounds the plurality of first dies; disposing a plurality of second dies on a package substrate, wherein the substrate is on the package substrate, wherein the plurality of second dies have top surfaces that are substantially coplanar to top surface of the plurality of first dies, wherein the plurality of second dies are adjacent to outer edges of the plurality of first dies, the substrate, and the encapsulation layer, wherein the substrate conductively couples the plurality of first dies to the package substrate, wherein the BSM layer and the interface layer are respectively over the plurality of first and second dies, wherein the heat spreader includes a TIM that thermally couples the BSM layer to the heat spreader, wherein the heat spreader is over the plurality of first and second dies, the BSM layer, the interface layer, the substrate, and the package substrate, wherein the heat spreader includes a lid and a plurality of legs, wherein the lid of the heat spreader is directly on a top surface of the TIM or a top surface of the BSM layer, and wherein the plurality of legs of the heat spreader are directly on a top surface of the package substrate; and disposing an underfill material on the top surface of the package substrate, wherein the underfill material surrounds portions of the plurality of second dies, the encapsulation layer, and the substrate, wherein the interface layer includes a SiN material, a SiO material, a SiCN, or a thermal adhesive material, wherein the plurality of first dies have a first thickness that is less than a second thickness of the plurality of second dies, wherein the plurality of second dies include a HBM die, and wherein the TIM is a STIM.

Example 19 is a semiconductor package, comprising: a plurality of substrates on a package substrate; a plurality of first dies on the plurality of substrates; a plurality of second dies on the package substrate; an encapsulation layer over the plurality of substrates, wherein the encapsulation layer surrounds the plurality of first dies; a plurality of interface layers over the plurality of first dies and the encapsulation layer; a BSM layer directly on the plurality of interface layers, wherein the BSM layer includes a first conductive layer, a second conductive layer, and a third conductive layer, wherein the plurality of interface layers couple the plurality of first dies to the BSM layer, wherein the plurality of second dies are adjacent to outer edges of the plurality of first dies, the plurality of substrates, and the encapsulation layer, and wherein the plurality of second dies have top surfaces that are substantially coplanar to top surfaces of the plurality of first dies; a TIM over the third conductive layer of the BSM layer; and a heat spreader over the TIM and the package substrate, wherein the first conductive layer of the BSM layer is directly coupled to the interface layer, and wherein the third conductive layer of the BSM layer is directly coupled to the TIM.

In example 20, the subject matter of example 19 can optionally include that a bottom surface of the first conductive layer is directly on a top surface of the interface layer, wherein the second conductive layer is directly between the first and third conductive layers, wherein the interface layer couples the plurality of first dies to the BSM layer, wherein the first conductive layer of the BSM layer includes a Ti material, wherein the second conductive layer of the BSM layer includes a Ni—V material, wherein the third conductive layer of the BSM layer includes an Au material.

In example 21, the subject matter of examples 19-20 can optionally include that the third conductive layer of the BSM layer includes an Ag material or a Cu material.

In example 22, the subject matter of examples 19-21 can optionally include that the Cu material of the third conductive layer includes a first Cu layer or a second Cu layer, wherein the second Cu layer has a plurality of conductive bumps, and wherein the plurality of conductive bumps are a plurality of copper nano bumps.

In example 23, the subject matter of examples 19-22 can optionally include an underfill material on the top surface of the package substrate, wherein the underfill material surrounds portions of the plurality of second dies, the encapsulation layer, and the plurality of substrates, wherein the plurality of substrates conductively couple the plurality of first dies to the package substrate, wherein the heat spreader includes a lid and a plurality of legs, wherein the lid of the heat spreader is directly on a top surface of the TIM or a top surface of the BSM layer, and wherein the plurality of legs of the heat spreader are directly on a top surface of the package substrate.

In example 24, the subject matter of examples 19-23 can optionally include that the interface layer includes a SiN material, a SiO material, a SiCN, or a thermal adhesive material.

In example 25, the subject matter of examples 19-24 can optionally include that the plurality of first dies have a first thickness that is less than a second thickness of the plurality of second dies, wherein the plurality of second dies include a HBM die, and wherein the TIM is a STIM.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:

a plurality of first dies on a substrate;

an interface layer over the plurality of first dies;

a backside metallization (BSM) layer directly on the interface layer, wherein the BSM layer includes a first conductive layer, a second conductive layer, and a third conductive layer; and a heat spreader over the BSM layer, wherein the first conductive layer of the BSM layer is directly coupled to the interface layer, and wherein the third conductive layer of the BSM layer is directly coupled to the heat spreader.

2. The semiconductor package of claim 1, wherein a bottom surface of the first conductive layer is directly on a top surface of the interface layer, wherein the second conductive layer is directly between the first and third conductive layers, wherein a bottom surface of the heat spreader is directly over a top surface of the third conductive layer, and wherein the interface layer couples the plurality of first dies to the BSM layer.

3. The semiconductor package of claim 1, wherein the first conductive layer of the BSM layer includes a titanium (Ti) material.

4. The semiconductor package of claim 1, wherein the second conductive layer of the BSM layer includes a nickel-vanadium (Ni—V) material.

5. The semiconductor package of claim 1, wherein the third conductive layer of the BSM layer includes a gold (Au) material, wherein the first conductive layer of the BSM layer has a thickness that is substantially equal to a thickness of the third conductive layer of the BSM layer, and wherein the second conductive layer of the BSM layer has a thickness that is greater than the thicknesses of the first and third conductive layers of the BSM layer.

6. The semiconductor package of claim 1, wherein the third conductive layer of the BSM layer includes a silver (Ag) material or a copper (Cu) material.

7. The semiconductor package of claim 6, wherein the Cu material of the third conductive layer includes a first Cu layer or a second Cu layer, wherein the second Cu layer has a plurality of conductive bumps, and wherein the plurality of conductive bumps are a plurality of copper nanotechnology (nano) bumps.

8. The semiconductor package of claim 1, further comprising:

an encapsulation layer over the substrate, wherein the encapsulation layer surrounds the plurality of first dies;

a plurality of second dies on a package substrate, wherein the substrate is on the package substrate, wherein the plurality of second dies have top surfaces that are substantially coplanar to top surface of the plurality of first dies, wherein the plurality of second dies are adjacent to outer edges of the plurality of first dies, the substrate, and the encapsulation layer, wherein the substrate conductively couples the plurality of first dies to the package substrate, wherein the BSM layer and the interface layer are respectively over the plurality of first and second dies, wherein the heat spreader includes a thermal interface material (TIM) that thermally couples the BSM layer to the heat spreader, wherein the heat spreader is over the plurality of first and second dies, the BSM layer, the interface layer, the substrate, and the package substrate, wherein the heat spreader includes a lid and a plurality of legs, wherein the lid of the heat spreader is directly on a top surface of the TIM or a top surface of the BSM layer, and wherein the plurality of legs of the heat spreader are directly on a top surface of the package substrate; and an underfill material on the top surface of the package substrate, wherein the underfill material surrounds portions of the plurality of second dies, the encapsulation layer, and the substrate.

9. The semiconductor package of claim 1, wherein the interface layer includes a silicon nitride (SiN) material, a silicon monoxide (SiO) material, a silicon carbon nitride (SiCN), or a thermal adhesive material.

10. The semiconductor package of claim 8, wherein the plurality of first dies have a first thickness that is less than a second thickness of the plurality of second dies, wherein the plurality of second dies include a high-bandwidth memory (HBM) die, and wherein the TIM is a solder TIM (STIM).

11. A semiconductor package, comprising:

a plurality of substrates on a package substrate;

a plurality of first dies on the plurality of substrates;

a plurality of second dies on the package substrate;

an encapsulation layer over the plurality of substrates, wherein the encapsulation layer surrounds the plurality of first dies;

a plurality of interface layers over the plurality of first dies and the encapsulation layer;

a BSM layer directly on the plurality of interface layers, wherein the BSM layer includes a first conductive layer, a second conductive layer, and a third conductive layer, wherein the plurality of interface layers couple the plurality of first dies to the BSM layer, wherein the plurality of second dies are adjacent to outer edges of the plurality of first dies, the plurality of substrates, and the encapsulation layer, and wherein the plurality of second dies have top surfaces that are substantially coplanar to top surfaces of the plurality of first dies;

a TIM over the third conductive layer of the BSM layer; and a heat spreader over the TIM and the package substrate, wherein the first conductive layer of the BSM layer is directly coupled to the interface layer, and wherein the third conductive layer of the BSM layer is directly coupled to the TIM.

12. The semiconductor package of claim 11, wherein a bottom surface of the first conductive layer is directly on a top surface of the interface layer, wherein the second conductive layer is directly between the first and third conductive layers, wherein the interface layer couples the plurality of first dies to the BSM layer, wherein the first conductive layer of the BSM layer includes a Ti material, wherein the second conductive layer of the BSM layer includes a Ni—V material, wherein the third conductive layer of the BSM layer includes an Au material, wherein the first conductive layer of the BSM layer has a thickness that is substantially equal to a thickness of the third conductive layer of the BSM layer, and wherein the second conductive layer of the BSM layer has a thickness that is greater than the thicknesses of the first and third conductive layers of the BSM layer.

13. The semiconductor package of claim 11, wherein the third conductive layer of the BSM layer includes an Ag material or a Cu material.

14. The semiconductor package of claim 13, wherein the Cu material of the third conductive layer includes a first Cu layer or a second Cu layer, wherein the second Cu layer has a plurality of conductive bumps, and wherein the plurality of conductive bumps are a plurality of copper nano bumps.

15. The semiconductor package of claim 11, further comprising an underfill material on the top surface of the package substrate, wherein the underfill material surrounds portions of the plurality of second dies, the encapsulation layer, and the plurality of substrates, wherein the plurality of substrates conductively couple the plurality of first dies to the package substrate, wherein the heat spreader includes a lid and a plurality of legs, wherein the lid of the heat spreader is directly on a top surface of the TIM or a top surface of the BSM layer, and wherein the plurality of legs of the heat spreader are directly on a top surface of the package substrate.

16. The semiconductor package of claim 11, wherein the interface layer includes a SiN material, a SiO material, a SiCN, or a thermal adhesive material.

17. The semiconductor package of claim 11, wherein the plurality of first dies have a first thickness that is less than a second thickness of the plurality of second dies, wherein the plurality of second dies include a HBM die, and wherein the TIM is a STIM.

* * * * *